United States Patent [19]

Maner et al.

[11] Patent Number: 5,045,439
[45] Date of Patent: Sep. 3, 1991

[54] PROCESS FOR THE LITHOGRAPHIC MANUFACTURE OF ELECTROFORMABLE MICROSTRUCTURES HAVING A TRIANGULAR OR TRAPEZOIDAL CROSS-SECTION

[75] Inventors: Asim Maner, Linkenheim; Jurgen Mohr, Sulzfeld, both of Fed. Rep. of Germany

[73] Assignee: Kernforschungszentrum Karlsruhe GmbH, Fed. Rep. of Germany

[21] Appl. No.: 452,018

[22] Filed: Dec. 18, 1989

[30] Foreign Application Priority Data

Dec. 16, 1988 [DE] Fed. Rep. of Germany ....... 3842354

[51] Int. Cl.$^5$ .......................... G03C 5/06; G03C 5/00
[52] U.S. Cl. .................................... 430/394; 430/320; 430/322; 355/39; 355/52
[58] Field of Search ................ 430/394, 396, 320, 2, 430/327, 8, 397, 322, 320, 321, 395; 355/39, 52

[56] References Cited

U.S. PATENT DOCUMENTS 4,264,714  4/1981  Trausch .............................. 430/320
4,935,334  7/1990  Boettiger et al. ................... 430/322

OTHER PUBLICATIONS

J. Mohr et al., KfK 4414, Analyse der Defektursachen und der Genauigkeit der Strukturubertragung bei der Rontgentiefenlithographie mit Synchrotronstrahlung.

Primary Examiner—David Welsh
Assistant Examiner—S. Rosasco
Attorney, Agent, or Firm—Sughrue, Mion, Zinn, Macpeak & Seas

[57] ABSTRACT

A process for the lithographic manufacture of electroformable microstructure having a triangular or trapezoidal cross-section from a resist material.

A composite body is provided which is comprised of a layer of resist material on an electrically conductive substrate. The resist layer is irradiated to form irradiated band regions in the resist layer by conducting a first irradiation in which the substrate having the resist layer thereon is positioned at an angle of $+\alpha$ relative to a plane orthogonal to the incident radiation to form a first set of band-shaped regions, and a second irradiation in which the substrate is positioned at an angle of $-\alpha$ relative to a plane orthogonal to the incident radiation to form a second set of band-shaped regions which overlap the first set at the interface between the resist layer and the substrate. The irradiated regions of the resist layer are developed to produce microstructures.

13 Claims, 2 Drawing Sheets

PROCESS FOR THE LITHOGRAPHIC MANUFACTURE OF ELECTROFORMABLE MICROSTRUCTURES HAVING A TRIANGULAR OR TRAPEZOIDAL CROSS-SECTION

FIELD OF THE INVENTION

The present invention relates to a process for the lithographic manufacture of electroformable microstructures having a triangular or trapezoidal cross-section from a resist material.

BACKGROUND OF THE INVENTION

A process for forming electroformable microstructures having a triangular or trapezoidal cross-section from a resist material is disclosed in the publication of J. Mohr, W. Ehrfeld and D. Munchmeyer, Kernforschungszentrum Karlsruhe, Report KfK-4414, entitled "Analysis of the Causes of Defects and the Accuracy of Structure Reproduction in Deep-Etch X-Ray Lithography using Synchroton Radiation" called the "LIGA process". Report KfK-4414 is herein incorporated by reference.

In the above-noted publication, the manufacture of microstructures having slanted sidewalls, i.e., sidewalls slanted relative to the plane of the resist layer, is described. In Chapter 2, the effects on the quality of the fabricated microstructures is described, when employing a mask which is positioned at an angle relative to the incident radiation and which has mask openings which allow radiation to strike the resist layer.

Thus, microstructures that have slanted sidewalls relative to the resist plane, and in principle, microstructures having a triangular or trapezoidal cross-section, can be manufactured by positioning (e.g. by tilting) the plane of the mask at an angle relative to the incident radiation. According to KfK-4414, however, this method results in the attenuation of the radiation dose at the edge region of the mask openings. As a result, portions of the resist material which correspond to the edge region of the microstructures to be fabricated are only partially irradiated by means of reflection and diffraction effects.

As a consequence, when developing the resist structures, the partially irradiated portions of the resist material become partially detached. During subsequent electroplating, the microstructures thus obtained are deformed and have inaccurate dimensions.

Furthermore, KfK-4414 also describes an investigation relating to the influence of masks that are arranged orthogonally to the incident radiation, with mask openings having walls slanted relative to the incident radiation.

According to page 86 of KfK-4414, an attractive possibility for the manufacture of conical microstructures having a small angle of conicity is described. However, this proposal is disadvantageous because the mask is to be fabricated with mask openings having slanted walls, such that the conicity of the resulting microstructures are restricted to small angles. Furthermore, a new mask having designedly slanted mask opening walls must be fabricated for each desired microstructure.

SUMMARY OF THE INVENTION

A first object of the present invention is to provide a process for the lithographic manufacture of electroformable microstructures from a resist material which overcomes the above drawbacks of the prior art.

A second object of the present invention is to provide a process for the lithographic manufacture of electroformable microstructures having a triangular or trapezoidal cross-section from a resist material using conventional masks having vertical mask opening walls.

A third object of the present invention is to provide such a process in which the degree of slant of the sidewalls of the microstructure thus produced may be varied within a wide range without having to change the mask structure.

A fourth object of the present invention is to provide a process wherein the linearity of the microstructure walls is not degraded by the reflection and diffraction of the irradiating means.

Additional objects and advantages of the present invention will be set forth in part in the description which follows and in part will be obvious from the description or can be learned by practice of the invention. The objects and advantages are achieved by means of the processes, instrumentalities and combinations particularly pointed out in the appended claims.

It has been discovered that this and other objectives of the present invention are attained by a process for the lithographic manufacture of electroformable microstructures having a triangular or trapezoidal cross-section from a resist material, comprising the steps of: (a) providing a composite body comprised of a layer of resist material on an electrically conductive substrate; (b) irradiating the resist layer to form band-shaped regions in the resist layer by conducting a first irradiation in which the substrate having the resist layer thereon is positioned at an angle of $+\alpha$ relative to a plane orthogonal to the incident radiation to form a first set of band-shaped regions in the resist layer, and then conducting a second irradiation in which the substrate is positioned at an angle of $-\alpha$ relative to a plane orthogonal to the incident radiation to form a second set of band-shaped regions in the resist layer which overlap with the first set of band-shaped regions at the interface between the resist layer and the substrate; and (c) developing the first and second sets of band-shaped irradiated regions of the resist layer to produce spaced-apart microstructures in the resist layer and expose the electrically conductive substrate in the spaces between the microstructures.

Preferably, the irradiation is performed by applying an incident beam of radiation through mask openings of a mask which is positioned orthogonally to the incident beam of radiation. The openings in the mask preferably are slotted openings. The resist layer can also be irradiated by a focused and moved beam.

In one embodiment of the invention, the angle $\alpha$ is equal to arcsine $(a/2d)$ where $a$ is the distance between the mask openings and where $d$ is the thickness of the resist layer so that the regions irradiated in the first and second irradiations overlap at the surface of the resist layer, to thereby provide microstructures having a triangular cross-section.

In another embodiment of the invention, the angle $\alpha$ is smaller than arcsine $(a/2d)$ where $a$ is the distance between the mask openings and $d$ is the thickness of the resist layer to thereby provide microstructures having a trapezoidal cross-section.

In still another embodiment of the invention, the substrate having the resist layer thereon is rotated by an angle of $\beta$ within a plane orthogonal to the incident radiation after the second irradiation. The so-rotated resist layer can then be further irradiated by conducting a third irradiation in which the substrate having the resist layer thereon is positioned at an angle of $+\alpha$ relative to a plane orthogonal to the incident radiation to form a third set of band-shaped regions in the resist layer, and then conducting a fourth irradiation in which the substrate is positioned at an angle of $-\alpha$ relative to a plane orthogonal to the incident radiation to form a fourth set of band-shaped regions in the resist layer which overlap at the interface between the resist layer and the substrate, and the third and fourth sets of band-shaped irradiated regions of the resist layer can then be developed.

The first and second sets of band-shaped, irradiated regions can be developed before the third irradiation, and the third and fourth sets of band-shaped irradiated regions can be developed after the fourth irradiation.

Alternatively, the first, second, third and fourth sets of band-shaped irradiated regions of the resist layer can be developed after the fourth irradiation.

Preferably, the angle o in the four irradiations is equal to arcsine (a/2d) where a is the distance between the mask openings and where d is the thickness of the resist layer, so that the regions irradiated in the first and second irradiations overlap at the surface of the resist, and the regions irradiated in the third and fourth irradiations overlap at the surface of the resist layer, to thereby provide microstructures comprising a plurality of square pyramids.

It is to be understood that both the foregoing general description and the following detailed description are exemplary and explanatory, but are not restrictive of the invention.

DETAILED DESCRIPTION OF THE INVENTION

Figure 1:
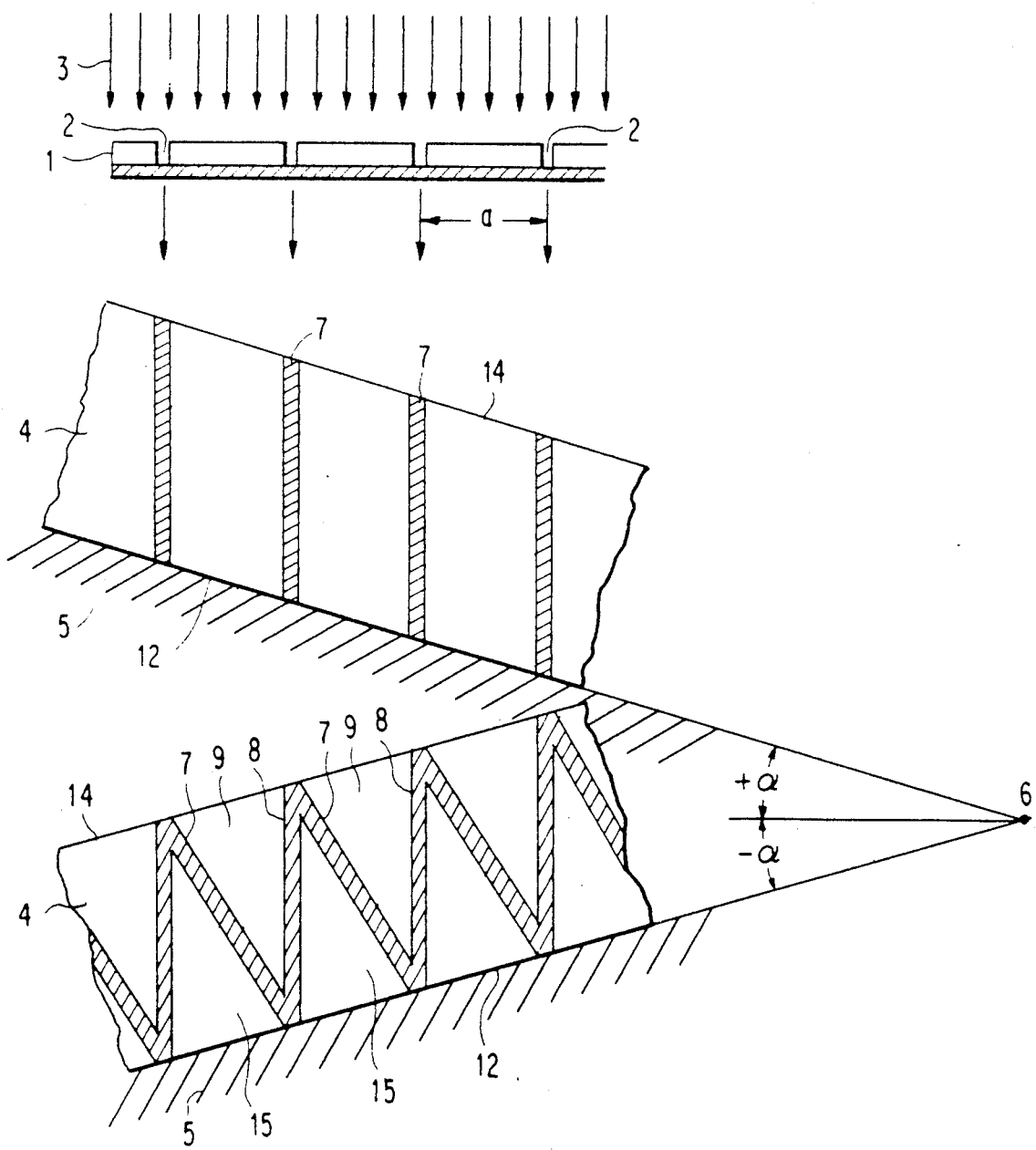
FIG. 1 shows the arrangement of the mask and resist layer relative to the incident radiation in accordance with the present invention.

In the present invention, a resist layer is irradiated with radiation. This irradiation of the resist layer preferably occurs by use of a mask which has mask openings through which the radiation passes.

The mask for use in the present invention has perforations or openings which are defined by mask walls that are perpendicular to the plane of the mask. The plane of the mask is positioned orthogonally to the incident radiation. Such masks having vertical walls are simpler to manufacture than masks having openings or perforations that are formed by mask walls that are slanted relative to the plane of the mask.

For the process of the present invention, masks having slotted openings are preferably used.

The electrically conductive substrate having the resist layer applied thereon is positioned at an angle of $+\alpha$ relative to a plane orthogonal to the incident radiation (i.e., a plane parallel to the plane of the mask), and the resist layer is irradiated a first time through the mask. This positioning can be achieved by rotating the resist layer about an axis of rotation so that the resist layer is not in a plane which is parallel to the plane of the mask. The axis of rotation lies in the plane of the interface between the resist layer and substrate.

This first irradiation of the resist layer forms a first set of irradiated band-shaped regions in the resist layer.

Next, the substrate and resist layers are positioned at an angle of $-\alpha$ relative to a plane orthogonal to the incident radiation, and the resist layer is irradiated a second time to form a second set of irradiated band-shaped regions in the resist layer. This positioning can be achieved by rotating the resist layer about the same axis of rotation that was used in the first irradiation.

The process may then be repeated after rotating the twice irradiated substrate by an angle $\beta$ within the plane parallel to the plane of the mask to perform a third and fourth irradiation, also at angles of $+\alpha$ and $-\alpha$ relative to a plane orthogonal to the incident radiation. The angle $\alpha$ in the third and fourth irradiations can assume a different angle compared with the angle $\alpha$ in the first and second irradiation. The axis of rotation for all irradiations must lie in the plane of the interface between the resist layers and the substrate. The resist layer can be developed after all of the irradiations, or can be developed after each irradiation, or can be developed after any suitable number of irradiations, such as after the second irradiation and then after the fourth irradiation. In one embodiment of the invention, the resist layer is developed a first time following the second irradiation, and is developed a second time following the fourth irradiation.

The angle $\alpha$ is selected such that the first and second irradiated regions overlap at the interface between resist material and electrically conductive substrate. Similarly, the third and fourth irradiated regions will overlap at this interface.

Depending on the selected angle $\alpha$, microstructures having a triangular or trapezoidal cross-section are obtained as a function of the thickness of the layer of resist material and of the distance between the irradiation rays which strike the resist layer. When a mask having mask openings is used for the irradiation, the distance between the irradiation rays which strike the resist layer is the distance between the mask openings.

Figure 2A:
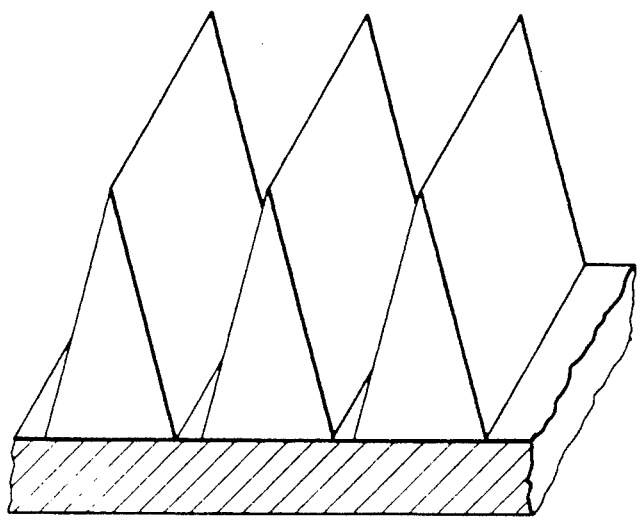
FIG. 2a is a perspective view of resist block microstructures having a triangular cross-section, prepared by twice irradiating and developing the resist layer in accordance with one embodiment of the present invention.
Figure 2B:
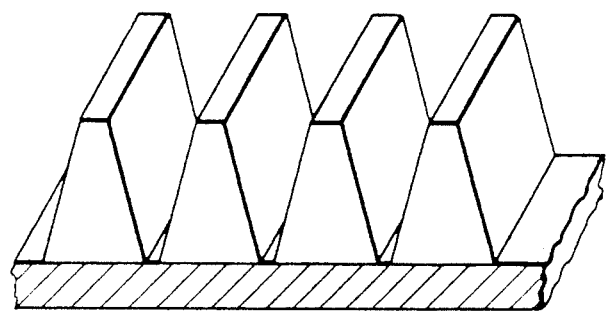
FIG. 2b is a perspective view of resist block microstructures having a trapezoidal cross-section, prepared by twice irradiating and developing the resist layer in accordance with another embodiment of the present invention.

Trapezoidal cross-sections such as shown in FIG. 2b are obtained when $$\alpha < \text{arcsine (a/2d)},$$

whereas when $$\alpha = \text{arcsine (a/2d)}$$

triangular cross-sections such as shown in FIG. 2a are obtained, where a is the distance between the irradiation rays which strike the resist layer (and is equal to the distance between the mask openings when a mask is employed) and where d is the thickness of the resist layer. The angle $\alpha$ can assume values up to 20°; the corresponding parameters a and d interfaces the given equations.

Turning now to FIG. 1, there is shown a mask 1 having slots 2. Mask 2 is aligned orthogonally to an incident beam of radiation 3.

A plurality of slots 2 are spaced from each other at an interval of "a" on mask 1 and have vertical walls (i.e., mask wall openings that are orthogonal to the incident beam).

In a first irradiation, an electrically conductive substrate 5 having applied thereon a resist layer 4, is positioned at an angle of $+\alpha$ relative to a plane parallel to the plane of mask 1 about an axis of rotation 6. Axis of rotation 6 lies in the plane of the interface 12 between resist layer 4 and substrate 5 and can be located in any point of this plane.

The incident radiation that is not blocked by the opaque portions of the mask penetrates resist layer 4 through slots 2 to form a first set of band-shaped irradiated regions 7 within resist layer 4. The distance between the band-shaped regions 7 is determined by the spacing a of the slots of the mask. The angle between the band shaped regions 7 and the perpendicular of the plane of the interface 12 is equal to the angle $\alpha$.

In a second irradiation, substrate 5 having the resist layer 4 thereon is positioned about the axis of rotation 6 by the angle $(-\alpha)$ relative to a plane parallel to the plane of the mask. The incident radiation that is not blocked by the opaque portions of the mask penetrate resist layer 4 through slots 2 to form a second set of band-shaped irradiated regions 8 within resist layer 5.

Band-shaped regions 7 and 8 overlap at the interface 12 of resist layer 4 and substrate 5 and, in the case of microstructures having a triangular cross-section, also overlap at the surface 14 of the resist layer, that is, at its free surface which is located away from interface 12.

The irradiation means for use in the present invention includes, for examples, an X-ray beam which is partially shaded with a mask arranged orthogonally thereto, or a focused and moved beam as generated by an electron beam writes. In the latter case, a mask is not necessary. In this case, the distance a is given by the distance of the parallel planes, in which the focused beam is moved. The angle $\alpha$ 13 determined as the angle between a plane orthogonal to the beam and the plane of the interface between the resist layer and the substrate.

The mask and resist layer described in KfK-4414 may be used in the process of the present invention.

For example, a gold patterned X-ray mask may be used.

In the present invention, electrically conductive substrate 5 may be, for example, a stainless steel plate or a copper plate having thin film of nickel coated thereon. The plate thickness is generally from about 1 to 10 mm thick, and also serves as a plating cathode for electrode position. Substrate 5 further can be treated by, for example, chemical oxidation to improve adhesion with the resist.

Polymethyl methacrylate (PMMA) or another material that is suitable for the LIGA process can be used as the resist material. Conventional adhesion promoters may also be used to promote adhesion of the resist to the substrate.

The irradiated regions can be developed (removed) in a conventional manner using, for example, a developer containing 60% by vol. of 2-(2-butoxy ethoxy ethanol), 20% by vol. of tetrahydro-1, 4-oxazine, 15% by vol. of water and 5% by vol. of 2-amino- ethanol at a temperature of 35° C.

In the process of the present invention, during development, irradiated regions 7 and 8 are removed. Irradiated regions 7 and 8 define unradiated regions 9 of the resist layer which have a band-shaped structure with a triangular cross-section, and unradiated regions 15 which also have band-shaped structure with a triangular cross-section. As a result of the overlap of irradiated regions 7 and 8 at the interface of resist layer 4 and substrate 5, unradiated regions 9 are not in contact with substrate 5. Unradiated regions 15, however, have a base area 16 which is in contact with the substrate 5. When the irradiated regions 7 and 8 of resist layer 4 that enclose unradiated regions 9 are dissolved during development, unradiated regions 9 are also removed from resist layer 4 since they are not in contact with substrate 5 and are not otherwise supported or connected to the resist layer. The dissolving away and removal of regions 7, 8 and 9 leave behind microstructures corresponding to regions 15 which are spaced-apart from each other and expose electrically conductive substrate 5 in the spaces between the microstructures. The exposed spaces correspond to the overlapped 15 portions of regions 7 and 8 at the interface of resist layer 4 and substrate 5.

The microstructures thus prepared can be electroformed in the exposed spaces with metal in a conventional manner, such as by using the electrically conductive substrate as a cathode during the electroplating.

In a second embodiment of the present invention, the twice irradiated resist layer 4 may be subjected to a third and fourth irradiation, also at angle of $+\alpha$ and $-\alpha$ relative to a plane orthogonal to the incident radiation, wherein the substrate having the resist layer thereon is first rotated by an angle $\beta$ of approximately 90° within the plane parallel to the plane of the mask and then subjected to the third and fourth irradiations.

Figure 3:
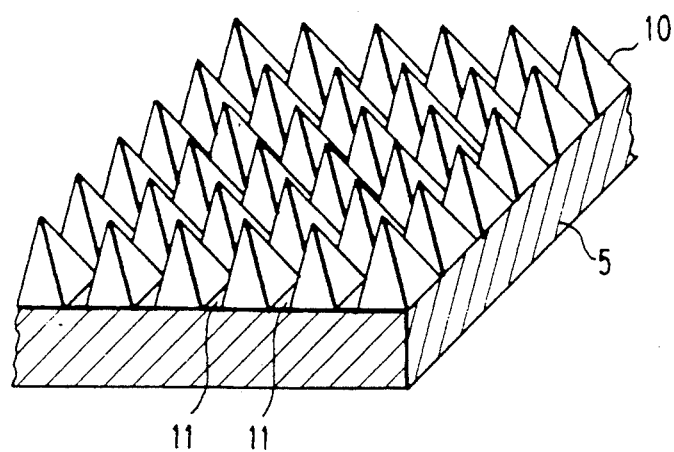
FIG. 3 is a perspective view of resist microstructures comprising a plurality of square pyramids, produced by four times irradiating and developing the resist layer in accordance with a further embodiment of the present invention.

If the angle $\beta$ is 90° and the angle $\alpha$ equals arcsine (a/2d), the microstructures shown in FIG. 3 are obtained.

These microstructures comprise a plurality of square resist pyramids 10, which are separated from one another by a network of grooves 11 that run at right angles, on the substrate 5.

The electrically conductive substrate is exposed (i.e., complete resist removal) within the grooves 11.

The invention is explained in detail in reference to the following non-limiting Example.

EXAMPLE 1

A $4 \times 4$ cm$^2$ mask, which has slots that are 3 cm long and 20 $\mu$m wide at intervals of 220 $\mu$m, is arranged orthogonally to the incident beams of an ray beam source.

A $2 \times 2$ cm$^2$ resist layer, which is 400 $\mu$m thick and made of PMMA, is applied on a metal plate. The metal plate serves as a substrate and is made of stainless steel with a thickness of 6 mm The resist layer is spaced 3 mm from the plane of the mask and the substrate having the resist layer applied thereon is rotated out of the plane of the mask about a first axis of rotation by an angle of $+\alpha = 16°$ and then subjected to an initial irradiation.

After the first irradiation, the substrate having the resist layer applied thereon is rotated out of the plane of the mask about the first axis of rotation by the angle $-\alpha$ and irradiated a second time.

Subsequently, the resist layer is developed in a conventional manner, resulting in a structure analogous to that shown in FIG. 2a.

The substrate having the thus pretreated resist layer thereon is rotated by an angle of $\beta = 90°$ in the plane parallel to the plane of the mask and in turn is irradiated a third and fourth time in the above-described manner. Thus, in the third irradiation, the resist layer is positioned at an angle $+\alpha$ relative to a plane orthogonal to the incident radiation, and in the fourth irradiation, it is positioned at an angle $-\alpha$ relative to that plane.

After development, square pyramidal microstructures analogous to that shown in FIG. 3 are obtained.

These microstructures may be electroformed with metal in a conventional manner. After electroforming, the resist structures and the substrate are then removed by pulling off the electroformed part to provide a metal tool having pyramidal openings. Pyramidal-shaped plastic structures may then be fabricated by using the metal tool having pyramidal openings as a mold.

While the invention has been described in detail and with reference to specific examples thereof, it will be apparent to one skilled in the art that various changes and modifications can be made therein without departing from the spirit and scope thereof.

What is claimed is:

1. A process for the lithographic manufacture of electroformable microstructures having a triangular or trapezoidal cross-section from a resist material, comprising the steps of:
   (a) providing a composite body comprised of a layer of resist material on an electrically conductive substrate;
   (b) irradiating the resist layer to form irradiated band-shaped regions in the resist layer by conducting a first irradiation in which the substrate having the resist layer thereon is positioned at an angle of $+\alpha$ relative to a plane orthogonal to the incident radiation to form a first set of band-shaped regions in the resist layer, and then conducting a second irradiation in which the substrate is positioned at an angle of $-\alpha$ relative to a plane orthogonal to the incident radiation to form a second set of band-shaped regions in the resist layer which overlap with the first set of band-shaped regions at the interface between the resist layer and the substrate; and
   (c) developing the first and second sets of band-shaped irradiated regions of the resist layer to produce spaced-apart microstructures in the resist layer and expose the electrically conductive substrate in the spaces between the microstructures.

2. A process as in claim 1, wherein irradiating is performed by applying an incident beam of radiation through mask openings of a mask which is positioned orthogonally to the incident beam of radiation.

3. A process as claimed in claim 2, wherein the angle $\alpha$ is equal to arcsine $(a/2d)$ where a is the distance between the mask openings and where d is the thickness of the resist layer so that the regions irradiated in the first and second irradiations overlap at the surface of the resist layer, to thereby provide microstructures having a triangular cross-section.

4. A process as in claim 2, wherein the angle $\alpha$ is smaller than arcsine $(a/2d)$ where a is the distance between the mask openings and d is the thickness of the resist layer to thereby provide microstructures having a trapezoidal cross-section.

5. A process according to claim 2, wherein the openings in the mask are slotted openings.

6. A process as in claim 1, further comprising the steps of:
   rotating the substrate having the resist layer thereon by an angle of $\beta$ within a plane orthogonal to the incident radiation after the second irradiation;
   irradiating the so-rotated resist layer by conducting a third irradiation in which the substrate having the resist layer thereon is positioned at an angle of $+\alpha$ relative to a plane orthogonal to the incident radiation to form a third set of band-shaped regions in the resist layer, and then conducting a fourth irradiation in which the substrate is positioned at an angle of $-\alpha$ relative to a plane orthogonal to the incident radiation to form a fourth set of band-shaped regions in the resist layer which overlap a the interface between the resist layer and the substrate; and
   developing the third and fourth sets of band-shaped irradiated regions of the resist layer.

7. A process as in claim 6, further comprising developing the first and second sets of band-shaped, irradiated regions before the third irradiation, and developing the third and fourth sets of band-shaped irradiated regions after the fourth irradiation.

8. A process as in claim 6, comprising developing the first, second, third and fourth sets of band-shaped irradiated regions of the resist layer after the fourth irradiation.

9. A process as in claim 6, wherein the irradiating is performed by applying an incident beam of radiation through mask openings of a mask which is positioned orthogonally to the incident beam of radiation, and the angle $\alpha$ is equal to arcsine $(a/2d)$ where a is the distance between the mask openings and where d is the thickness of the resist layer, so that the regions irradiated in the first and second irradiations overlap at the surface of the resist, and the regions irradiated in the third and fourth irradiations overlap at the surface of the resist layer, to thereby provide microstructures comprising a plurality of square pyramids.

10. A process as in claim 6, wherein the irradiating is performed by applying an incident beam of radiation through mask openings of a mask which is positioned orthogonally to the incident beam of radiation.

11. A process as in claim 10, wherein the openings in the mask are slotted openings.

12. A process as in claim 1, wherein the resist layer is irradiated with an X-ray beam source and the resist material is polymethyl methacrylate.

13. A process as in claim 1, wherein the resist layer is irradiated by a focused and moved beam.

* * * * *